(12) United States Patent
Xu et al.

(10) Patent No.: US 11,950,419 B2
(45) Date of Patent: Apr. 2, 2024

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Zongke Xu, Wuhan (CN); Bin Yuan, Wuhan (CN); Xiangning Wang, Wuhan (CN); Qiangwei Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 456 days.

(21) Appl. No.: 17/231,966

(22) Filed: Apr. 15, 2021

(65) Prior Publication Data

US 2022/0293627 A1 Sep. 15, 2022

Related U.S. Application Data

(63) Continuation of application No. PCT/CN2021/080731, filed on Mar. 15, 2021.

(51) Int. Cl.
| | | |
|---|---|---|
| H10B 41/10 | (2023.01) | |
| H10B 41/27 | (2023.01) | |
| H10B 41/35 | (2023.01) | |
| H10B 43/10 | (2023.01) | |
| H10B 43/27 | (2023.01) | |
| H10B 43/35 | (2023.01) | |

(52) U.S. Cl.
CPC ............ *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ................................ H10B 43/10; H10B 41/10
See application file for complete search history.

(56) References Cited

U.S. PATENT DOCUMENTS

| | | | |
|---|---|---|---|
| 2014/0063890 A1* | 3/2014 | Lee | ........................ G11C 5/063 257/773 |
| 2016/0293624 A1 | 10/2016 | Sonehara et al. | |
| 2018/0301374 A1 | 10/2018 | Masamori et al. | |

(Continued)

FOREIGN PATENT DOCUMENTS

| | | |
|---|---|---|
| CN | 107994031 A | 5/2018 |
| CN | 109496356 A | 3/2019 |

(Continued)

OTHER PUBLICATIONS

International Search Report issued in corresponding International Application No. PCT/CN2021/080731 dated Dec. 16, 2021, 5 pages.

*Primary Examiner* — Alia Sabur
(74) *Attorney, Agent, or Firm* — BAYES PLLC

(57) ABSTRACT

A three-dimensional (3D) memory device is provided. In an example, the 3D memory device includes a staircase and a plurality of groups of support structures through the staircase. The plurality of groups of support structures are arranged in a first direction, and each of the groups of support structures comprises three support structures, wherein projections of the three support structures form a triangular shape in a plane parallel to the first direction.

19 Claims, 10 Drawing Sheets

(56) References Cited

U.S. PATENT DOCUMENTS

| | | | |
|---|---|---|---|
| 2019/0244970 A1 | 8/2019 | Jung et al. | |
| 2020/0185412 A1 | 6/2020 | Lee et al. | |
| 2020/0303398 A1 | 9/2020 | Otsu et al. | |
| 2020/0312865 A1* | 10/2020 | Ge | H10B 41/60 |

FOREIGN PATENT DOCUMENTS

| | | |
|---|---|---|
| CN | 111211130 A | 5/2020 |
| CN | 112272868 A | 7/2020 |
| CN | 112466885 A | 3/2021 |
| CN | 112490247 A | 3/2021 |

* cited by examiner

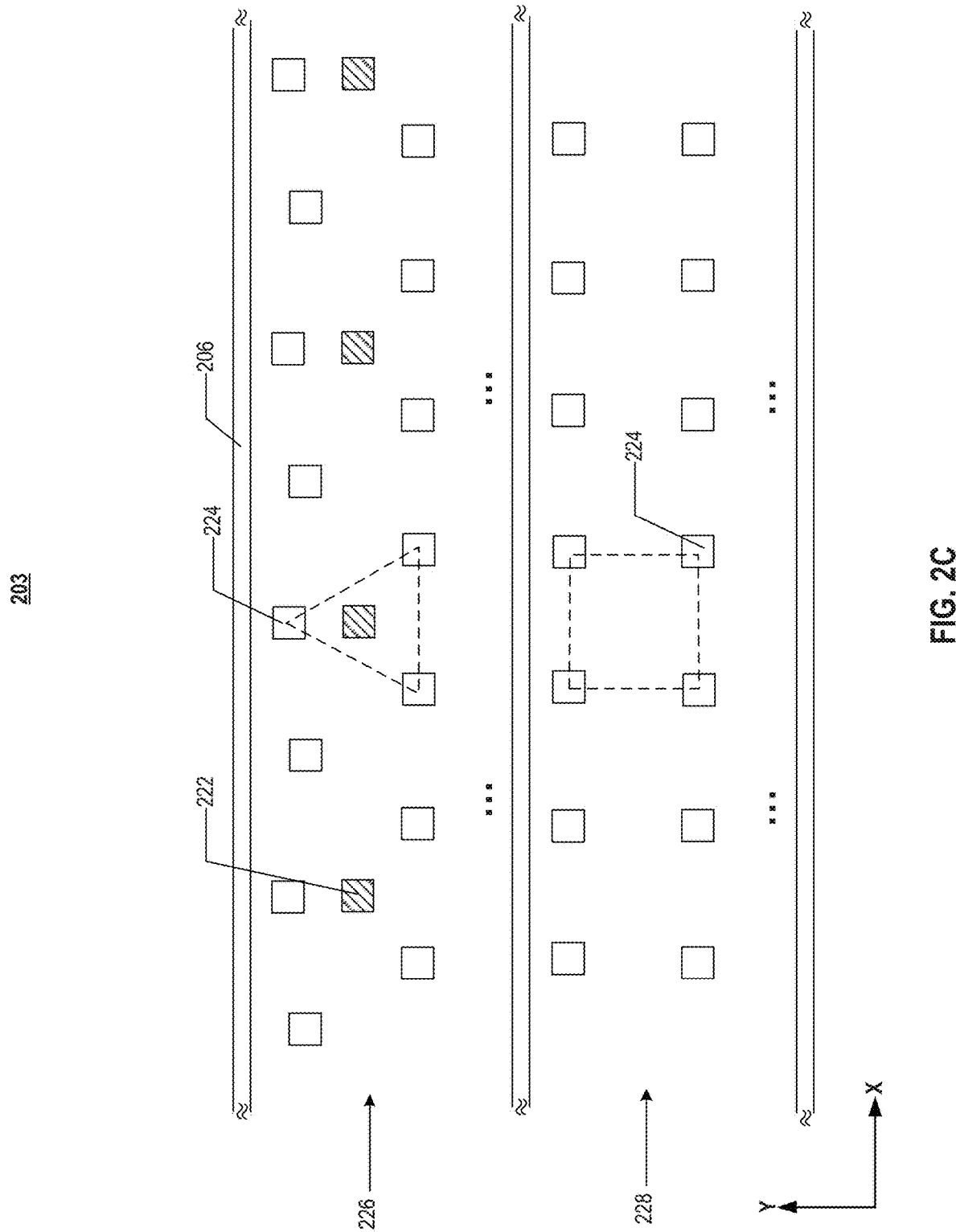

THREE-DIMENSIONAL MEMORY DEVICES AND METHODS FOR FORMING THE SAME

CROSS-REFERENCE TO RELATED APPLICATIONS

This application is continuation of International Application No. PCT/CN2021/080731, filed on Mar. 15, 2021, entitled "THREE-DIMENSIONAL MEMORY DEVICES AND METHODS FOR FORMING THE SAME," which is hereby incorporated by reference in its entirety.

BACKGROUND

The present disclosure relates to three-dimensional (3D) memory devices having conductive layers of improved stability and reduced susceptibility to overlap between word line contacts and support structures, and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Implementations of 3D memory devices with improved designs of support structures and word line contacts and methods for forming the 3D memory devices are provided.

In one example, a 3D memory device includes a staircase and a plurality of groups of support structures through the staircase. The plurality of groups of support structures are arranged in a first direction. Each of the groups of support structures includes three support structures, wherein projections of the three support structures form a triangular shape in a plane parallel to the first direction.

In another example, a 3D memory device includes a plurality of contacts aligned in a row in a first direction on a staircase and a plurality of support structures aligned in a plurality of rows in the first direction. The row of the contacts and the plurality of rows of the support structures are apart from one another in a second direction perpendicular to the first direction. Each of the contacts is surrounded by a group of support structures, and the group of support structures includes three support structures, wherein projections of the three support structures form a triangular shape in a plane parallel to the first direction.

In a further example, a method for forming a 3D memory device includes forming a stack structure of a plurality of first layers and a plurality of second layers interleaved above a substrate, and forming a staircase in a staircase region of the stack structure. The staircase includes a plurality of stairs. The method also includes forming a plurality of groups of support structures in the staircase and forming a contact on a respective one of the stairs. The plurality of groups of support structures each includes three support structures, wherein projections of the three support structures form a triangular shape in a plane parallel to a first direction.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

FIG. 2C illustrates a top view of another exemplary 3D memory device having support structures and word line contacts, according to some implementations of the present disclosure.

Figure 1:
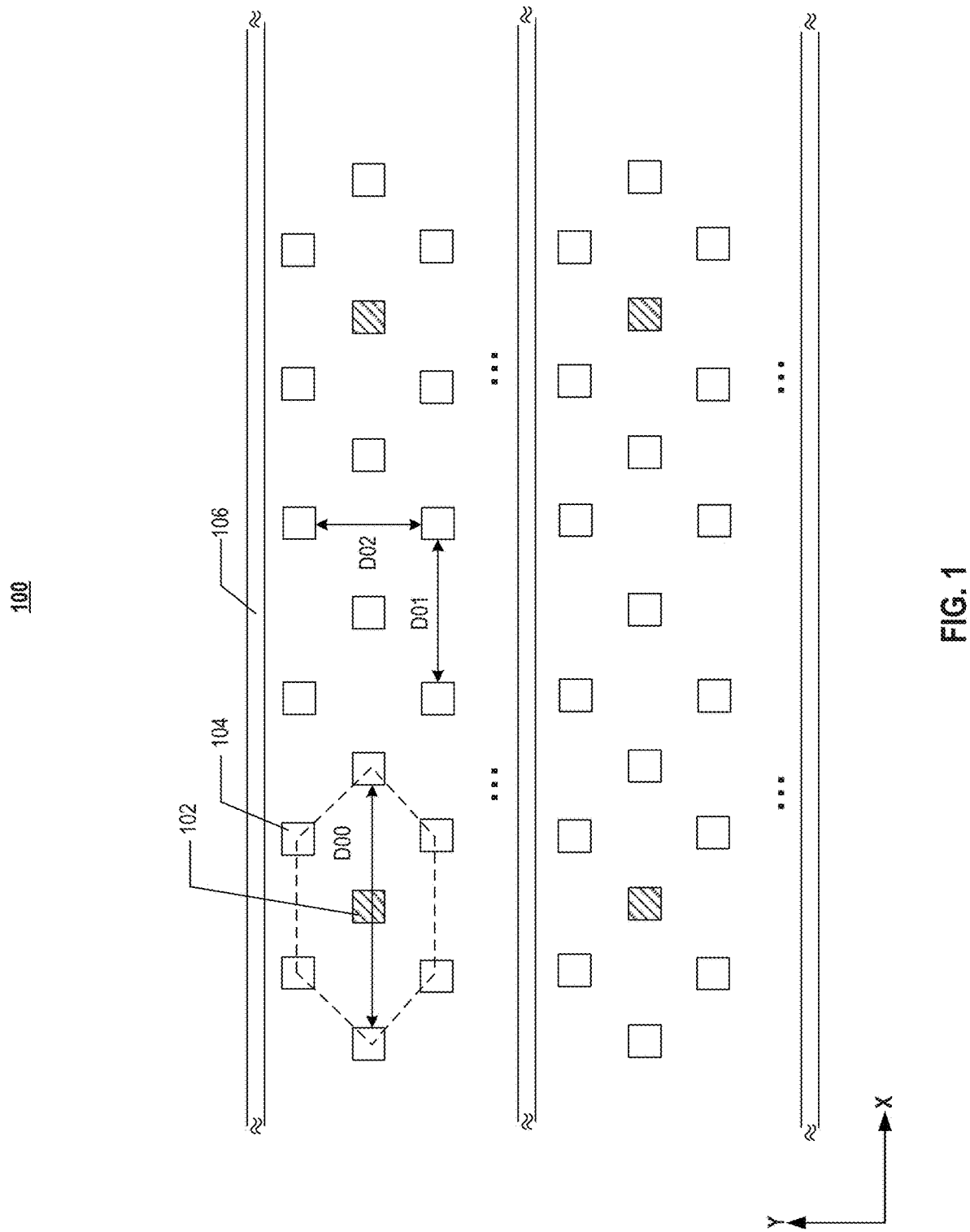
FIG. 1 illustrates a top view of a 3D memory device with support structures and word line contacts.

Implementations of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, a staircase refers to a set of surfaces that include at least two horizontal surfaces (e.g., along x-y plane) and at least two (e.g., first and second) vertical surfaces (e.g., along the z-direction) such that each horizontal surface is adjoined to a first vertical surface that extends upward from a first edge of the horizontal surface, and is adjoined to a second vertical surface that extends downward from a second edge of the horizontal surface. A "step" or "stair" refers to a vertical shift in the height of a set of adjoined surfaces. In the present disclosure, the term "stair" and the term "step" refer to one level of a staircase and are used interchangeably. In the present disclosure, a horizontal direction can refer to a direction (e.g., the x-direction or the y-direction) parallel with the top surface of the substrate (e.g., the substrate that provides the fabrication platform for the formation of structures over it), and a vertical direction can refer to a direction (e.g., the z-direction) perpendicular to the top surface of the structure.

NAND flash memory devices, widely used in various electronic products, are non-volatile, light-weighted, of low power consumption and good performance. Currently, planar NAND flash memory devices have reached their storage limit. To further increase the storage capacity and reduce the storage cost per bit, 3D NAND memory devices have been proposed. An existing 3D NAND memory device often includes a number of levels (or conductor/dielectric layer pairs) and a plurality of channel structures. The conductive layers function as word lines, which are conductively connected to a peripheral circuit through word line contacts. Memory cells are formed at the intersections of channel structures and conductive layers. As the number of levels increases for higher storage, more stress is introduced into the 3D NAND memory device due to the weight and distribution of the conductive layers, causing existing support structures to deform, e.g., bend. Sometimes, even the channel structures are deformed due to the stress. To reduce the stress in the conductive layers, support structures, such as dummy channels, are formed in a 3D NAND memory device. For example, the support structures are often formed in a staircase region of a 3D NAND memory device to balance the stress in the conductive layers.

However, in a 3D NAND memory device, a density of support structures, e.g., the number of support structures in a unit area, is often not sufficiently high to provide desirable support to the conductive layers. As a result, the word lines are still susceptible to bending, and the support structures can shift laterally, especially in the x-direction (e.g., the lateral direction in which the stairs in the staircase extend). The support structures can undesirably deviate from their purported locations. Consequentially, the deviation/shift in the lateral plane can cause the support structures to overlap with the openings that are formed in the insulating structure for forming the word line contacts. That is, at least some openings may fully or partially be landed on support structures. Because the insulating structure and the support structures often include similar or the same material(s), the conductive layers, often functioning as an etch-stop layer for the openings, may not stop the etching of the openings in the overlapping areas. As a result, the support structures can be etched. The damages to the support structures can impair the stress balancing. When a conductive material is deposited to fill the openings, short circuit can occur.

FIG. 1 illustrates a top view of a staircase region in a 3D memory device 100. As shown in FIG. 1, a plurality of word line contacts 102 and a plurality of support structures 104 are formed between adjacent gate-line slits 106 in the staircase region, in which a staircase is formed extending in the x-direction. Each word line contact 102 is surrounded by six support structures 104, which form a hexagon shape in the lateral plane (e.g., the x-y plane). At their purported locations, word line contacts 102 are aligned with some support structures 104 in the x-direction. Amongst the six support structures 104, in the x-direction, a distance DOO between two support structures 104 on the two sides of respective word line contact 102 is in a range of about 570 nm to about 700 nm, and a distance D01 between two adjacent support structures 104 is about 335 nm. In the y-direction, a distance between two adjacent support structures 104 is about 335 nm to about 420 nm. The density of the support structures 104 may not be sufficiently high to provide desirable support to the conductive layers. Also, the stress in the conductive layers can cause the six support structures 104 to have relative movement from one another, resulting the hexagon to deform, e.g., the six support structures 104 move unevenly in the lateral plane. That is, the hexagon may not maintain its shape as the result of shifting. The deformed shape can exacerbate the imbalance of stress in the conductive layers. Often, support structures 104 deviate from their purported locations and can shift laterally, e.g., in the x-direction. Word line contacts 102, when formed, may overlap with the support structures 104, causing damages to support structures 104 or even a short circuit. Yield loss in 3D memory device 100 may occur.

An existing solution to aid this issue is to calculate the overlap window between the support structures and the word line contacts, and perform simulations to verify the width of the overlap window. Then, the mask for patterning the support structures is corrected to remedy the shift of the support structures so as to reduce the overlap between the word line contacts and the support structures. This method can take an undesirably long time to complete because of the long learning cycle. The designs of the support structures and the word line contacts need to be improved.

The present disclosure provides 3D memory devices (e.g., 3D NAND memory devices) having improved designs of support structures and contacts (e.g., word line contacts) in the staircase region. Using the disclosed design/layout, for each contact landed on the staircase, a group of support structures are formed surrounding it. Different from a related 3D memory device, the group of support structures are arranged in a geometrically-stable shape in the lateral plane. The geometrically-stable shape refers to a shape that can maintain itself even when the group of support structures shift in the lateral plane. For example, under the stress of the conductive layers, the group of support structures, if shifting in the lateral plane, can move evenly and still maintain the purported shape. The support structures arranged in the geometrically-stable shape can improve the support/balancing of stress in the conductive layers. In some implementations, the geometrically-stable shape includes a triangular shape, e.g., an isosceles triangular shape, an equilateral triangular shape, or a non-isosceles triangular shape. In some implementations, the geometrically-stable shape includes a quadrilateral shape, e.g., a rectangular shape or a square.

Also, using the disclosed design/layout, the contacts are each formed surrounded by the group of support structures. Different from a related 3D memory device, no support structure in the group is aligned with a respective contact in the x-direction. In some implementations, the contacts are aligned in a row in the x-direction, and the support structures in the respective group are aligned in separate rows that are parallel to the row of the contacts. The rows are interleaved with, e.g., apart from, one another and has no intersection in the lateral plane. The distance from a contact to a support structure in the respective group is sufficiently large to prevent any overlap between the contact and the support structure in the x-direction, even if the group of support structures shift in the lateral plane. In the meantime, in the lateral plane, the distances between a contact and a support structure in the respective group and between any two contact structures are desirably small such that the density of the support structures is higher compared to a related 3D memory device. Improve stress balancing can be provided to the conductive layers.

Figure 2A:
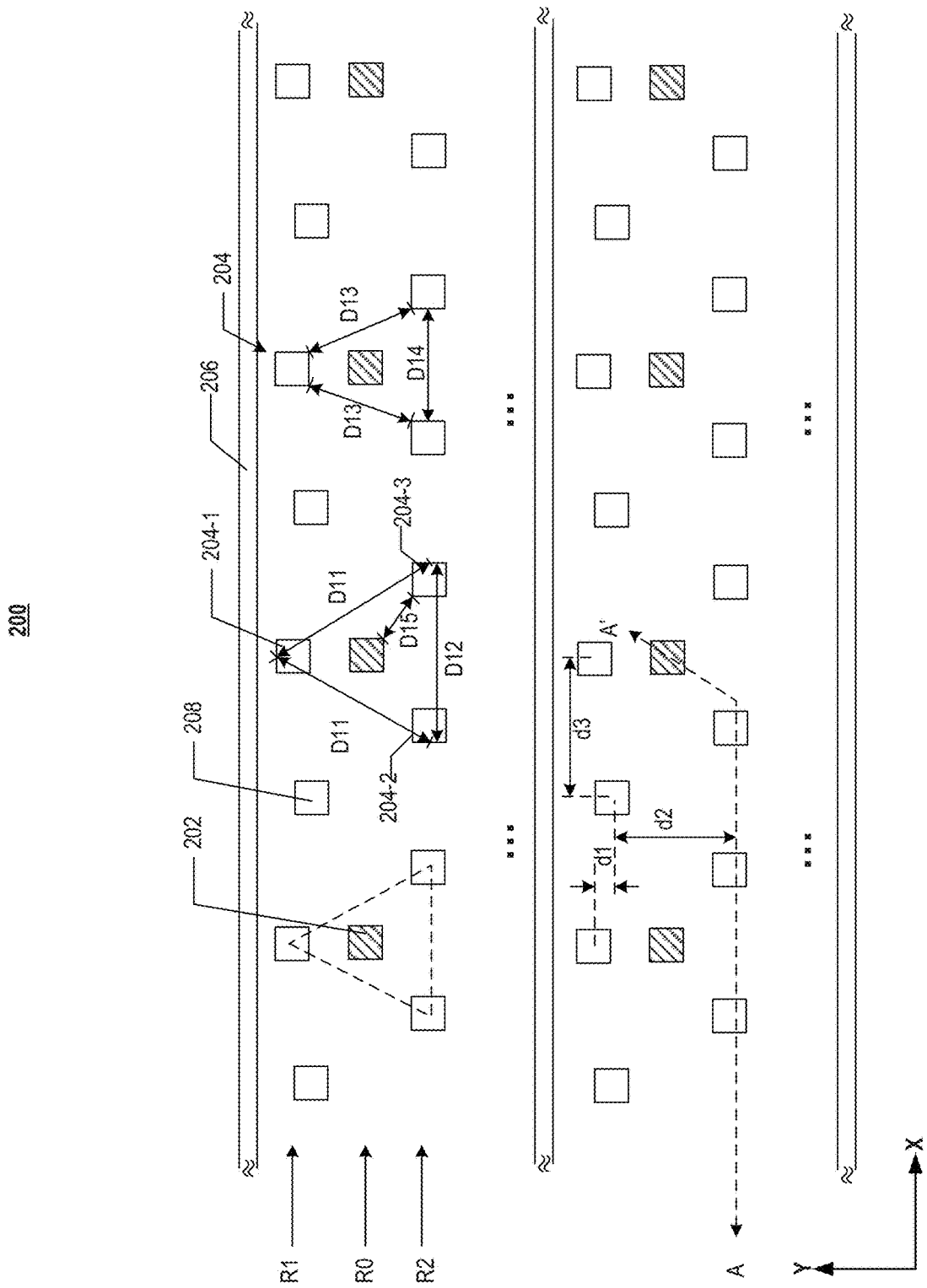
FIG. 2A illustrates a top view of an exemplary 3D memory device having support structures and word line contacts, according to some implementations of the present disclosure.
Figure 2B:
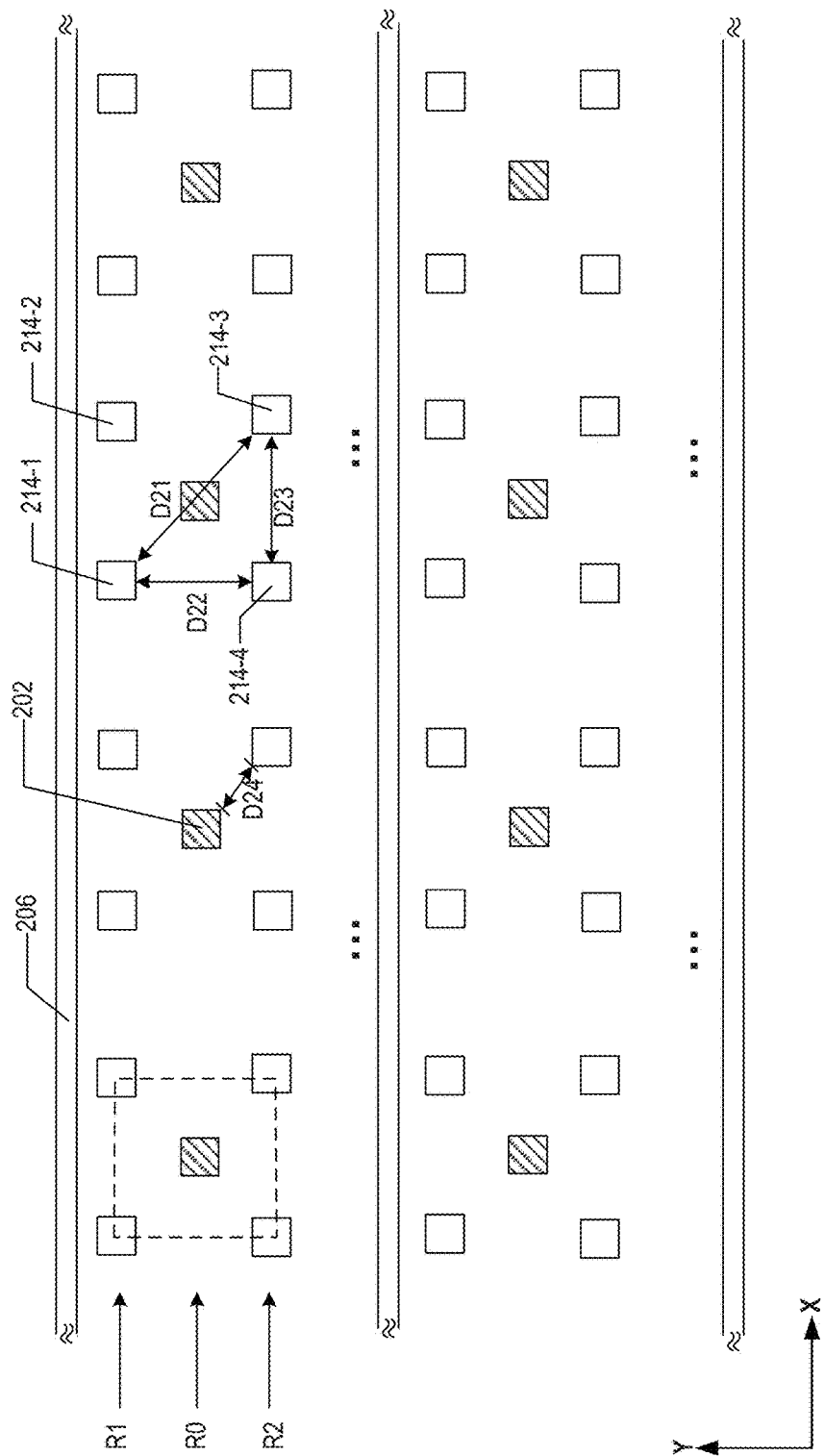
FIG. 2B illustrates a top view of another exemplary 3D memory device having support structures and word line contacts, according to some implementations of the present disclosure.

FIGS. 2A-2C each illustrates a top view of a layout/design of a 3D memory device (i.e., 200, 201, and 202) that includes support structures and contacts (e.g., word line contacts) in a staircase region, according to some implementations. In FIGS. 2A-2C, the x-direction represents the lateral direction (e.g., the word line direction) in which the stairs of the staircase extend, and they-direction represents the lateral direction perpendicular to the x-direction (e.g., the bit line direction). Each of the 3D memory device may include a plurality of gate-line slits 206 extending laterally in the x-direction. In some implementations, a source contact structure can be formed in each gate-line slit 206. The contacts between two adjacent gate-line slits 206 may be conductively connected to memory cells in a memory block of the respective 3D memory device through conductive layers (e.g., word lines) to implement various control operations. For ease of illustration, two adjacent fingers, each between a pair of gate-line 206, are shown in each of FIGS. 2A-2C as examples.

In some implementations, the support structures in each of 3D memory devices 200, 201, and 202 have a higher density compared to a related 3D memory device. The higher density can be at least partially determined by the arrangement of support structures surrounding a contact. In some implementations, a contact is surrounded by a group of support structures that are desirably close to the contact and to another support structure in the group such that the group of support structures may provide improved (e.g., higher and/or more uniform) support to the conductive layers. In some implementations, the group of support structures are less susceptible to shifting in the lateral plane compared to a related 3D memory device.

Meanwhile, in the laterally plane (e.g., the x-y plane), the connection of lines between the geometric centers of adjacent support structures (e.g., the geometric centers of the projections of the adjacent support structures on the x-y plane) in the group may form a geometrically-stable shape, which is defined as a shape that maintains itself even if the group of support structures undergo shift/movement. For example, if the group of support structures shifts/moves in the lateral plane because of stress, the support structures in the group may move uniformly, e.g., in the same direction(s) and by the same distance(s), such that the shape maintains in the lateral plane. In some implementations, the support structures in a group move uniformly in the x-direction under stress while maintaining the shape formed by these support structures. In some implementations, the support structures each has a lateral dimension of about 100 nm to about 300 nm, such as 100 nm, 150 nm, 200 nm, 250 nm, or 300 nm, in the x-direction and/or y-direction. In some implementations, the contacts each have a lateral dimension of about 70 nm to about 190 nm, such as 70 nm, 100 nm, 130 nm, 160 nm, or 190 nm, in the x-direction and/or y-direction.

FIG. 2A illustrates an arrangement of support structures and contacts in 3D memory device 200, according to some implementations. As shown in FIG. 2A, 3D memory device 200 may include a plurality of support structures 204 and a plurality of contacts 202 between two adjacent gate-line slits 206 in the staircase region of 3D memory device 200. Contacts 202 may be aligned with one another in a row R0 in the x-direction. In some implementations, contacts 202 may be evenly spaced in the x-direction. Each contact 202 may be surrounded by a group of support structures 204. In some implementations, in the laterally plane (e.g., the x-y plane), the group of support structures 204 may be arranged in a triangular shape. The triangular shape may include an equilateral triangular shape, an isosceles triangular shape, and/or a non-isosceles triangular shape. As shown in FIG. 2A, in the x-direction, no support structure 204 is located between adjacent contacts 202 (e.g., no support structure 204 is aligned with contacts 202). Even if support structures 204 shifts/moves from their purported locations in the x-direction, contacts 202 would not overlap with any support structures 204 in the x-direction.

In some implementations, as shown in FIG. 2A, the group of support structures 204 includes three support structures 204, which form an isosceles triangular shape around a respective contact 202. In the lateral plane, a first support structure 204-1 of each group may be aligned in a first row R1 in the x-direction, and a second support structure 204-2 and a third support structure 204-3 of each group may be aligned in a second row R2 in the x-direction. For example, in the lateral plane, a distance between the geometric centers of first and second support structures 204-1 and 204-2 may be equal to a distance between geometric centers of first and third support structures 204-1 and 204-3. A distance between second and third support structures 204-2 and 204-3 may or may not be equal to the distance between first and second support structures 204-1 and 204-2. In some implementations, rows R0, R1, and R2 are interleaved with, e.g., apart from, one another in they-direction such that rows R0, R1, and R2 are parallel with each other, and row R0 is between rows R1 and R2. In some implementations, in the y-direction, row R0 has an equal distance to each of rows R1 and R2. In some implementations, 3D memory device 300 also includes a plurality of support structures 208 that are not in a group of support structures 204 and are not part of a geometrically-stable shape. Support structures 208 may be located between groups of support structures 204 and may be aligned in a row, in the x-direction, i.e., parallel and interleaved with row R0. In some embodiments, support structures, e.g., 208 and 204, in a finger may be aligned with corresponding support structures in an adjacent finger. For example, in the y-direction, first support structures 204-1 in adjacent fingers may be aligned with each other, second support structures 204-2 in adjacent fingers may be aligned with each other, third support structures 204-3 in adjacent fingers may be aligned with each other, support structures 208 in adjacent fingers may be aligned with each other. Because gate-line slits 206, instead of extending continuously, may have a plurality of portions disconnected from one another in the x-direction, such arrangement may prevent support structures 208 from being formed (e.g., in case of fabrication deviation) between adjacent portions of gate-line slits 206, impacting conductivity in the staircase.

In some embodiments, in the x-direction, support structures 208 may not be aligned with first support structures 204-1 (e.g., row R1). In other words, support structures 208 may be staggered with first support structures 204-1 in the x-direction. In some embodiments, support structures 208 may also not be aligned with second support structures 204-2 or third support structures 204-3 (e.g., row R2). Such arrangement may avoid the merge of a critical dimension of support structure 208 (208-CD) and a CD of support structure 204 (204-CD) in the x-direction. The arrangement may also reduce the distance between support structures 208 and second/third support structures 204-2/204-3, further improving the support to the staircase. In some embodiments, a distance d1 between support structure 208 and the closest first support structures 204-1 in the y-direction (e.g., row R1) may be greater than or equal to half of the CD-208 and less than or equal to CD-208, i.e., (208-CD)/2≤d1≤208-CD. In some embodiments, a distance d2 between support structure 208 and the closest second/third support structures 204-2/204-3 in the y-direction (e.g., row R2) may be greater than or equal to half of the CD-208 and less than or equal to CD-208, i.e., (208-CD)/2≤d2≤208-CD. In some embodiments, a distance d3 between support structure 208 and the closest first support structures 204-1 in the x-direction may be greater than or equal to 1.5 times the CD-208 and less than or equal to 2.5 times CD-208, i.e., 1.5×208-CD≤d3≤2.5×208-CD.

In some implementations, a distance between two farthest support structures 204 in the group is in a range of about 350 nm to about 500 nm. The two farthest support structures 204 in the group may be referred to as the two support structures 204 that has the largest distance in the lateral plane, and the distance between these two support structures 204 may be defined as the distance between the middle points of two farthest boundaries of the two support structures 204. In some implementations, the distance between two farthest support structures 204 in the group is less than or equal to about 430 nm. In an example, first, second, and third support structures 204-1, 204-2, and 204-3 may form an isosceles triangular shape in the lateral plane. A distance D11 between first support structure 204-1 and second support structure 204-2 (or third support structure 204-3) may represent the distance between two farthest support structures 204 in the group. In some implementations, D11 is defined as a distance between the middle points of the outer boundary of first support structure 204-1 (e.g., in the positive y-direction) and the outer boundary of second support structure 204-2 (e.g., in the negative x-direction). Similarly, D11 can also be defined as a distance between the middle points of the outer boundary of first support structure 204-1 (e.g., in the positive y-direction) and the outer boundary of third support structure 204-3 (e.g., in the positive x-direction). In some implementations, D11 is less than or equal to about 430 nm. In some implementations, a distance D12 between the outer boundary of second support structure 204-2 (e.g., in the negative x-direction) and the outer boundary of third support structure 204-3 (e.g., in the positive x-direction) is less than or equal to about 430 nm. In some implementations, D11 is equal to D12, and are each in a range of about 300 nm to about 360 nm. For example, D11 is equal to D12, and are each equal to about 330 nm.

In some implementations, a minimum distance between two support structures 204 in the group is in a range of about 300 nm to about 450 nm. The minimum distance is defined as a distance between the nearest points/boundaries of two support structures 204. In some implementations, the minimum distance is less than or equal to about 430 nm. In an example, a distance D13 may represent the distance between the two nearest points of first support structure 204-1 and second support structure 204-2 (or third support structure 204-3), and a distance D14 may be the distance between the two nearest points of second support structure 204-2 and third support structure 204-3. In some implementations, D13 is equal to D14 and are each less than or equal to about 430. In some implementations, D13 and D14 are each in a range of about 300 nm to about 400 nm. In some implementations, D13 and D14 are each in a range of about 330 nm to about 390 nm. In some implementations, D13 and D14 are each equal to about 360 nm. In some implementations, in the lateral plane, a distance D15 between nearest points/boundaries of contact 202 and support structure 204 in the group is in a range of about 150 nm to about 300 nm, such as from about 150 nm to about 260 nm.

FIG. 2B illustrates another arrangement of support structures and contacts in 3D memory device 201, according to some implementations. As shown in FIG. 2B, 3D memory device 201 may include a plurality of support structures 214 and a plurality of contacts 202 between two adjacent gate-line slits 206. Contacts 202 may be aligned with one another in a row R0 in the x-direction. In some implementations, contacts 202 may be evenly spaced in the x-direction. Each contact 202 may be surrounded by a group of support structures 214. In some implementations, in the laterally plane (e.g., the x-y plane), the group of support structures 214 may be arranged in a quadrilateral shape. The quadrilateral shape may include a rectangular shape and/or a squared shape. As shown in FIG. 2B, in the x-direction, no support structure 214 is located between adjacent contacts 202 (e.g., no support structure 204 is aligned with contacts 202). Even if support structures 214 shifts/moves from their purported locations in the x-direction, contacts 202 would not overlap with any support structures 204 in the x-direction.

In some implementations, as shown in FIG. 2B, the group of support structures 214 includes four support structures 214, which form a rectangular shape around a respective contact 202. In the lateral plane, a first support structure 214-1 and a second support structure 214-2 of each group may be aligned in a first row R1 in the x-direction, and a third support structure 214-3 and a fourth support structure 214-4 of each group may be aligned in a second row R2 in the x-direction. For example, in the lateral plane, a distance between the geometric centers of first and third support structures 214-1 and 214-3 may be equal to a distance between geometric centers of second and fourth support structures 214-2 and 214-4, and a distance between the geometric centers of first and second support structures 214-1 and 214-2 may be equal to a distance between geometric centers of third and fourth support structures 214-3 and 214-4. In some implementations, the distances between the geometric centers of first and second support structures 214-1 and 214-2, second and third support structures 214-2 and 214-3, third and fourth support structures 214-3 and 214-4, and fourth and first support structures 214-4 and 214-1 may be equal to one another, and the quadrilateral shape has a squared shape. In some implementations, rows R0, R1, and R2 are interleaved with one another in the y-direction such that rows R0, R1, and R2 are parallel with each other, and row R0 is between rows R1 and R2. In some implementations, in the y-direction, row R0 has an equal distance to each of rows R1 and R2.

In some implementations, a distance between two farthest support structures 214 in the group is in a range of about 350 nm to about 500 nm. The two farthest support structures 214 in the group may be referred to as the two support structures 214 that has the largest distance in the lateral plane, and the distance between these two support structures 214 may be defined as the distance between the nearest points of the two support structures 214. In some implementations, the distance between two farthest support structures 214 in the group is less than or equal to about 430 nm. In an example, first, second, third, and fourth support structures 214-1, 214-2, 214-3, and 214-4 may form a rectangular shape in the lateral plane. A distance D21 between first support structure 214-1 and third support structure 214-3 (or the diagonal distance of the rectangular shape) may represent the distance between two farthest support structures 214 in the group. In some implementations, D21 is defined as a distance between the nearest points of first support structure 214-1 and the outer boundary of third support structure 214-3. Similarly, D21 can also be defined as a distance between the nearest points of second support structure 214-2 and fourth support structure 214-4. In some implementations, D21 is less than or equal to about 430 nm.

In some implementations, a minimum distance between two support structures 214 in the group is in a range of about 250 nm to about 400 nm, such from about 250 nm to about 380 nm. The minimum distance is defined as a distance between the nearest points/boundaries of two support structures 214. In some implementations, the minimum distance is less than or equal to about 430 nm. In some implementations, a distance D22 between the nearest boundaries of first support structure 214-1 and fourth support structure 214-4 is less than or equal to about 310 nm, and a distance D23 between the nearest boundaries of fourth support structure 214-4 and third support structure 214-3 is less than or equal to about 310 nm. In some implementations, the group of support structures 214 form a squared shape, and D22 is equal to D23. In some implementations, D22 and D23 may each be in a range of about 290 nm to about 330 nm. In an example, D21 may be equal to about 400 nm, and D22 and D23 may each be equal to about 290 nm. In some implementations, in the lateral plane, a distance D24 between nearest points/boundaries of contact 202 and support structure 214 in the group is in a range of about 150 nm to about 260 nm, such as from about 150 nm to about 260 nm.

In 3D memory devices 200 and 201, the contacts and the support structures may have the same arrangement in the staircase region. For example, in regions defined by different pairs of gate-line slits 206, the contacts are surrounded by the same number of support structures, which form the same shape in the lateral plane of the staircase region. FIG. 2C illustrates another arrangement of support structures and contacts in 3D memory device 203, according to some implementations. As shown in FIG. 2C, 3D memory device 201 may include a plurality of support structures 224 and a plurality of contacts 222 in a first region 226 and a second region 228, defined by gate-line slits 206. In some implementations, contacts 222 in first region 226 are each surrounded by a group of three support structures 224, which form a triangular shape in the lateral plane, similar to that in 3D memory device 200. In some implementations, no contact 222 is formed in second region 228, and support structures 224 may form a plurality of groups, each including four support structures forming a quadrilateral shape in the lateral plane. In some other implementations, no contact 222 is formed in first region 226. In some implementations, contacts 222 are formed in second region 228 such that each contact 222 is surrounded by a group of four support structures 224, similar to that in 3D memory device 201. In some implementations, contacts 222 are formed in each of first and second regions 226 and 228. For example, contacts 222 in first region 226 may be surrounded by a group of three support structures 224, similar to that in 3D memory device 200; and contacts 222 in second region 228 may be surrounded by a group of three support structures 224, similar to that in 3D memory device 201.

In various implementations, when no contact is formed to be surrounded by a group of three/four support structures 224, support structures 224 may still have the same or similar arrangement as described for 3D memory devices 200 and 201, and the detailed description is not repeated herein. It should be noted that first and second regions 226 and 228 may each represent any suitable region in the staircase region of 3D memory device 203 in which contacts and/or support structures can be formed. First and second regions 226 and 228 may be adjacent to each other or be separated from one another. The specific locations of first and second regions 226 and 228 should be subjected to the design of the respective 3D memory device and should not be limited by the implementations of the present disclosure.

It should be noted that, FIGS. 2A-2C of the present disclosure merely show the minimum rows of support structures in a finger to illustrate the arrangement of the support structures and do not represent the actual number/rows of support structures in a finger. For example, rows R1-R3 may repeat one or more times in the y-direction in a finger. That is, one or more group (e.g., 204 or 214) may be arranged in the y-direction in a finger. In some embodiments, each support structure (e.g., 204-1) may be aligned with a corresponding structure (e.g., 204-1) in another group in the same finger. The actual number of rows of support structures in a finger should not be limited by the embodiments of the present disclosure.

Figure 3A:
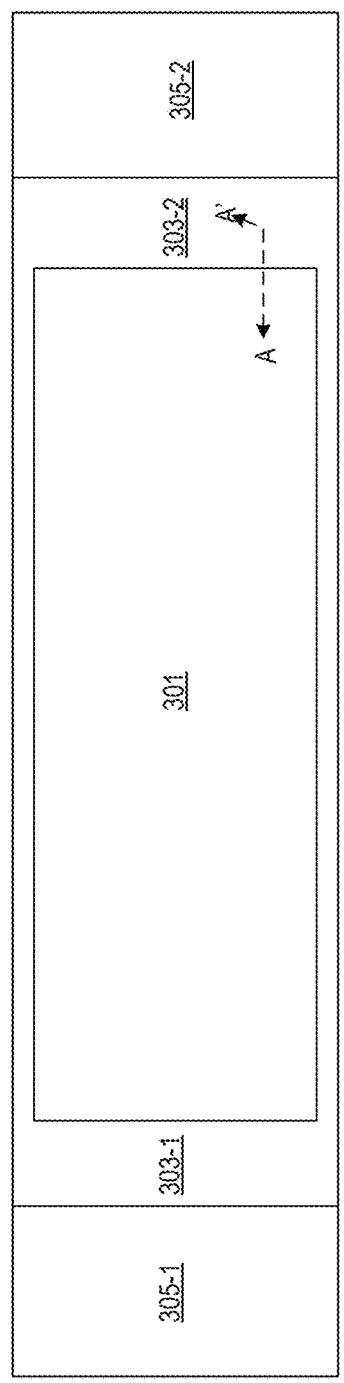
FIG. 3A illustrates a layout of an exemplary 3D memory device, according to some implementations of the present disclosure.

FIG. 3A illustrates a top view of a layout of a 3D memory device 300, according to some implementations. 3D memory devices 200, 201, and 203 described in FIGS. 2A-2C may each be an example of 3D memory device 300. As shown in FIG. 3A, 3D memory device 300 may include a core region 301, a pair of staircase regions 303-1 and 303-2, and a pair of other regions 305-1 and 305-2. Core region 301 may also be referred to as a device area in which memory cells are formed. Staircase regions 303-1 and 303-2 may be adjacent to core region 301 and each be on a respective side of core region in the x-direction. 3D memory devices 200, 201, and 202 may each be formed in staircase regions 304-1 and/or 304-2. Core region 301 and staircase regions 306-1 and 306-2 may form a die in 3D memory device 300. Other regions 305-1 and 305-2 may each be adjacent to a respective one of staircase region 303-1 and 303-2 in the x-direction. Other regions 305-1 and 305-2 may include scribe lanes between dies and other areas for miscellaneous functions.

Figure 3B:
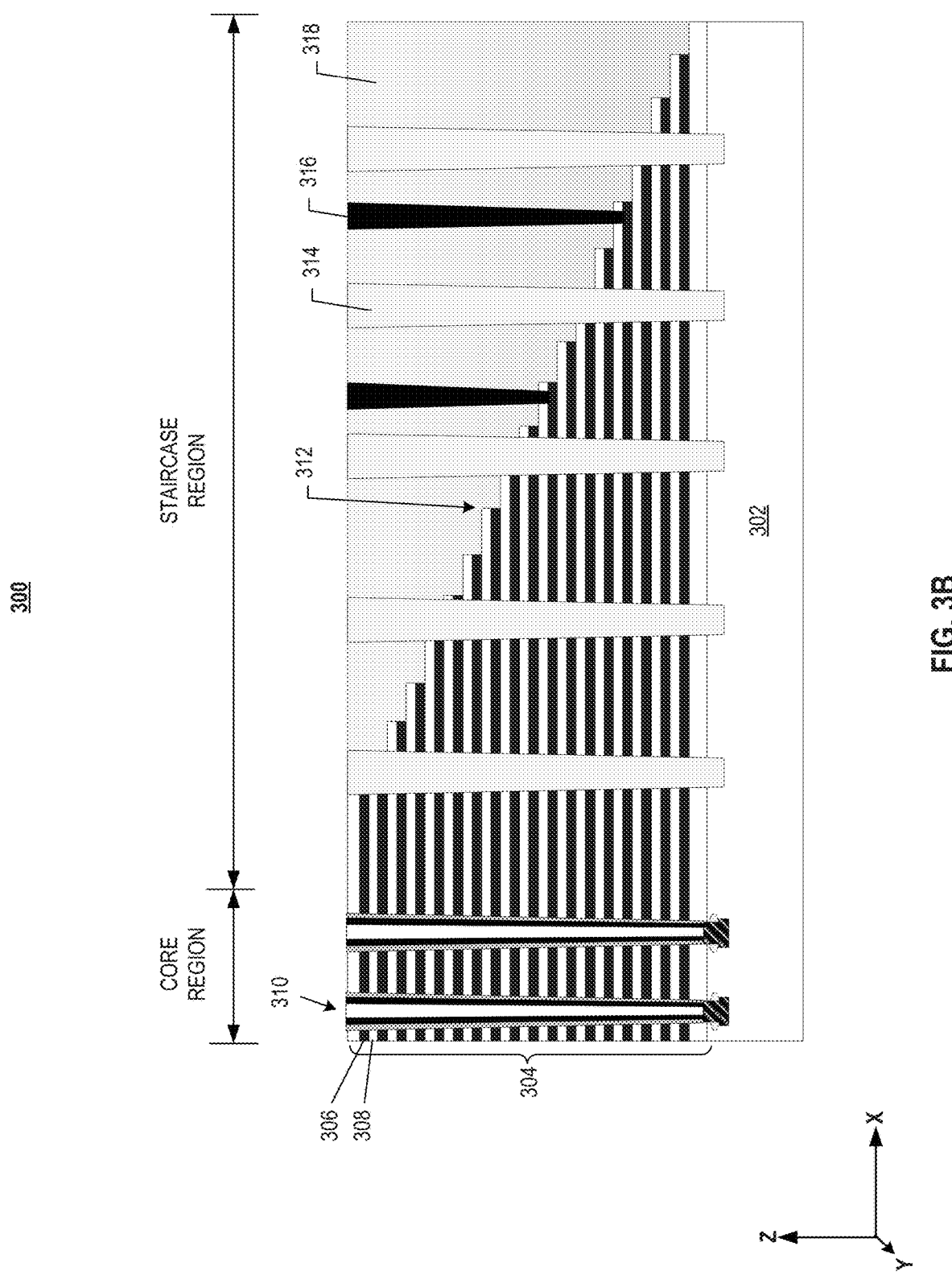
FIG. 3B illustrates a cross-sectional view of an exemplary 3D memory device having support structures and word line contacts, according to some implementations of the present disclosure.

FIG. 3B illustrates a cross-sectional view of 3D memory device 300 along an A-A' direction, according to some implementations. For ease of illustration, A-A' direction is also shown in FIG. 2A as an example. It is noted that FIG. 3B is merely intended to show the structures of support structures, contacts, staircase, and memory cells described in the present disclosure and is not meant to limit the number and exact locations of these structures. The arrangement of these structures in the lateral plane is similar to that described in 3D memory devices 200, 201, and 203, and the detailed descriptions are not repeated herein.

As shown in FIG. 3B, 3D memory device 300 includes a substrate 302, a stack structure 304 over substrate 302, and an insulating structure 318 over stack structure 304 such that stack structure 304 is located in insulating structure 318. Stack structure 304 may include a plurality of conductive layers 306 and a plurality of dielectric layers 308 interleaved with each other, forming a plurality of conductor/dielectric layer pairs. 3D memory device 300 may include a core region and a staircase region neighboring the core region. In the core region, 3D memory device 300 may include a plurality of channel structures 310 extending through stack structure 304 into substrate 302 along a vertical direction (e.g., the z-direction). In the staircase region, stack structure 304 may include a staircase having a plurality of stairs 312 extending laterally in the x-direction. 3D memory device 300 may include a plurality of support structures 314 extending in the staircase and insulating structure 318. 3D memory device 300 may also include a plurality of contacts 316 extending in insulating structure 318 and each landed on a respective stair 312 and in contact with a respective conductive layer 306. In some implementations, stack structure 304 may be a memory stack in which a plurality of memory cells are formed by the intersections of channel structures 310 and conductive layers 306. The number of the conductor/dielectric layer pairs in stack structure 304 (e.g., 32, 64, 96, or 128) determines the number of memory cells in 3D memory device 300.

Substrate 302 can include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, substrate 302 is a thinned substrate (e.g., a semiconductive layer), which was thinned by grinding, etching, chemical mechanical polishing (CMP), or any combination thereof.

In the core region, channel structures 310 may each extend vertically above substrate 302 in 3D memory device 200. Channel structure 310 may have a substantially cylindrical shape and may include a memory film, a semiconductive layer, and in some implementations, a dielectric core. A semiconductor channel can be formed in the semiconductive layer. In some implementations, memory film includes dielectric materials, and the semiconductive layer includes semiconductor materials. In some implementations, the semiconductive layer includes silicon, such as amorphous silicon, polysilicon, or single crystalline silicon. In some implementations, the memory film is a composite layer including a tunneling layer, a memory layer (also known as a "charge trap layer"), and a blocking layer. Optionally, the remaining space of the channel hole of the semiconductor channel can be partially or fully filled with a dielectric core including dielectric materials, such as silicon oxide. The dielectric core, semiconductive layer, the tunneling layer, the memory layer, and the blocking layer are arranged radially from the center toward the outer surface of the pillar in this order, according to some implementations. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, the memory layer can include a composite layer of silicon oxide/silicon oxynitride (or silicon nitride)/silicon oxide (ONO).

In some implementations, channel structure 310 further includes a semiconductor plug (e.g., an epitaxial portion) in the lower portion (e.g., at the lower end) of channel structure 310. As used herein, the "upper end" of a component (e.g., channel structure 310) is the end farther away from substrate 302 in the vertical direction, and the "lower end" of the component (e.g., channel structure 310) is the end closer to substrate 302 in the vertical direction when substrate 302 is positioned in the lowest plane of 3D memory device 300. The semiconductor plug can include a semiconductor material, such as silicon, which is epitaxially grown from or deposited on substrate 302. It is understood that in some implementations, the semiconductor plug includes single crystalline silicon, the same material as substrate 302. In other words, the semiconductor plug can include an epitaxially-grown semiconductive layer grown from substrate 302. The semiconductor plug can also include a different material than substrate 302 and can be epitaxially grown or deposited. In some implementations, the semiconductor plug includes at least one of silicon, germanium, and silicon germanium. The semiconductor plug may be conductively connected to the semiconductor channel and may function as part of a source structure of 3D memory device 300.

In some implementations, channel structure 310 further includes a drain structure (e.g., channel plug) in the upper portion (e.g., at the upper end) of channel structure 310. The drain structure can be in contact with the upper end of the semiconductor channel and may be conductively connected to the semiconductor channel. The drain structure can include semiconductor materials (e.g., polysilicon) or conductive materials (e.g., metals). In some implementations, the drain structure includes an opening filled with Ti/TiN or Ta/TaN as an adhesion layer and tungsten as a conductor material.

Conductive layers 306 and dielectric layers 308 in stack structure 304 are alternatingly arranged along the vertical direction in 3D memory device 300. Except for the top and bottom conductive layers 306, each conductive layer 306 is adjacent to a pair of dielectric layers 308, and vice versa. For ease of description, as shown in FIG. 3B, each dielectric layer 308 and the underlying conductive layer 306 are together referred to as a conductor/dielectric layer pair. Conductive layers 306 can include conductive materials including, but not limited to, tungsten (W), cobalt (Co), copper (Cu), aluminum (Al), polysilicon, doped silicon, silicides, or any combination thereof. Each conductive layer 306 can include a gate electrode (gate line) surrounded by an adhesion layer and a gate dielectric layer. The gate electrode of conductive layer 306 can extend laterally as a word line, ending at the staircase. Dielectric layers 308 can include dielectric materials including, but not limited to, silicon oxide, silicon nitride, silicon oxynitride, or any combination thereof.

In the staircase region, stack structure 304 may have a staircase, which includes a plurality of stairs 312, e.g., extending laterally along the x/y-direction in the staircase region. Each stair 312 may include one or more conductor/dielectric layer pairs. A contact 316 extending in insulating structure 318 may be in contact with and conductively connected to a top conductive layer 306 of a respective stair 312. Contact 316 can include conductive materials including, but not limited to, W, Co, Cu, Al, polysilicon, doped silicon, silicides, or any combination thereof. Insulating structure 318 can include dielectric materials including, but not limited to, silicon oxide, silicon nitride, silicon oxynitride, or any combination thereof.

A plurality of support structures 314 may be formed extending in the staircase region. Support structures 314 may have a cylindrical/pillar shape in the x-z plane. Support structures 314 may, along the vertical direction, extend in insulating structure 318 and the staircase. The lower surface of support structure 314 may be in contact with and/or below the upper surface of substrate 302. In some implementations, support structure 314 includes a suitable dielectric material, e.g., silicon oxide, silicon nitride, and/or silicon oxynitride.

In some implementations, the arrangement of contacts 316 and support structures 314 can be any one of the layouts described in FIGS. 2A-2C.

Although not depicted in FIG. 3B, 3D memory devices 300 may have a plurality of source contact structures, each having a dielectric spacer and a source contact in a respective gate-line slit. The source contact structures may extend in stack structure 304 vertically and laterally and may function as part of the source of the respective 3D memory device. The source contact may include a suitable conductive material such as W, Al, Co, Cu, polysilicon, silicides, or a combination thereof. The dielectric spacer may include a suitable dielectric material such as silicon oxide, silicon nitride, silicon oxynitride, or a combination thereof.

3D memory device 300 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory device 300 can be part of a non-monolithic 3D memory device, in which components (e.g., the peripheral device and memory array device) can be formed separately on different substrates and then bonded, for example, in a face-to-face manner. In some implementations, the memory array device substrate (e.g., substrate 302) remains as the substrate of the bonded non-monolithic 3D memory device, and the peripheral device (e.g., including any suitable digital, analog, and/or mixed-signal peripheral circuits used for facilitating the operation of 3D memory device 300, such as page buffers, decoders, and latches; not shown) is flipped and faces down toward the memory array device (e.g., NAND memory strings) for hybrid bonding. It is understood that in some implementations, the memory array device substrate (e.g., substrate 302) is flipped and faces down toward the peripheral device (not shown) for hybrid bonding, so that in the bonded non-monolithic 3D memory device, the memory array device is above the peripheral device. The memory array device substrate (e.g., substrate 302) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Figure 3C:
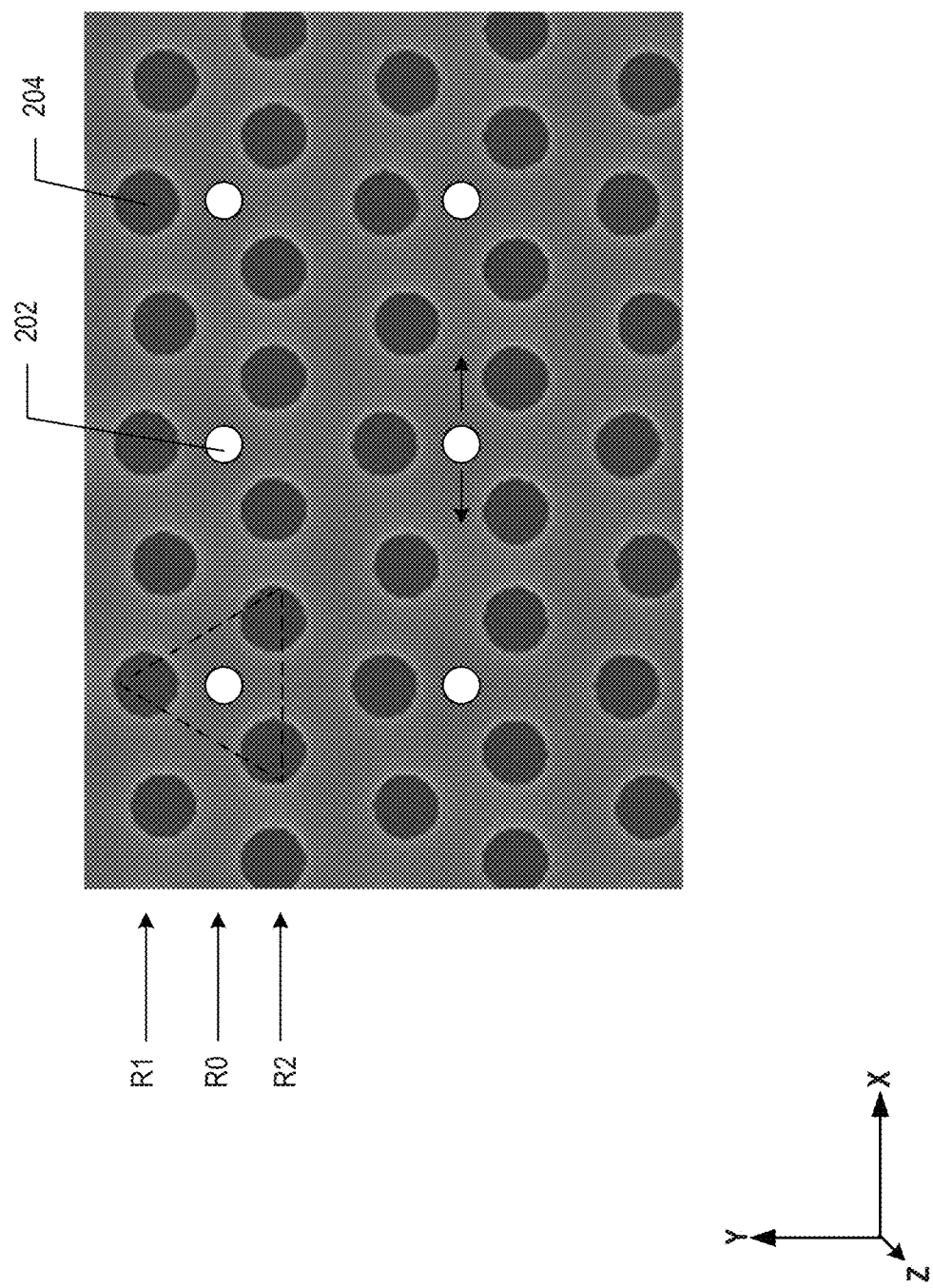
FIG. 3C illustrates an electron microscope (EM) image of an exemplary 3D memory device having support structures and word line contacts, according to implementations of the present disclosure.

FIG. 3C illustrates an EM image of an actual 3D memory device the same as 3D memory device 200. The actual 3D memory device may have variations in the dimensions and shapes of structures due to the patterning process. For example, the patterning/etching process that forms the openings for forming the contacts and the support structures can cause the openings to have circular shapes in the lateral plane. As shown in FIG. 3C, each contact 202 is surrounded by a group of three support structures 204 in the lateral plane, where the three support structures 204 form a triangular shape. The dimensions of contacts 202 and support structures 204 may vary from the designed dimensions. For example, the lateral dimensions of contacts 202 and support structures 204 may each deviate from the designed dimensions by a percentage of about ±30% (e.g., ±5%, ±10%, ±15%, ±20%, ±25%, or ±30%). In some implementations, the distances between support structures 204 in a group and between contact structure 202 and support structure 204 may also vary from the designed values by a percentage of about ±30% (e.g., ±5%, ±10%, ±15%, ±20%, ±25%, or ±30%). However, these variations would have little or no impact on the designed relative positions of contacts 202 and the surrounding support structures 204. Even if contacts 202 and the surrounding support structures 204 shift with each other in the x-direction, as illustrated in FIG. 3C by the arrows, no overlap between contacts 202 and the surrounding support structures 204 can occur.

Figure 4A:
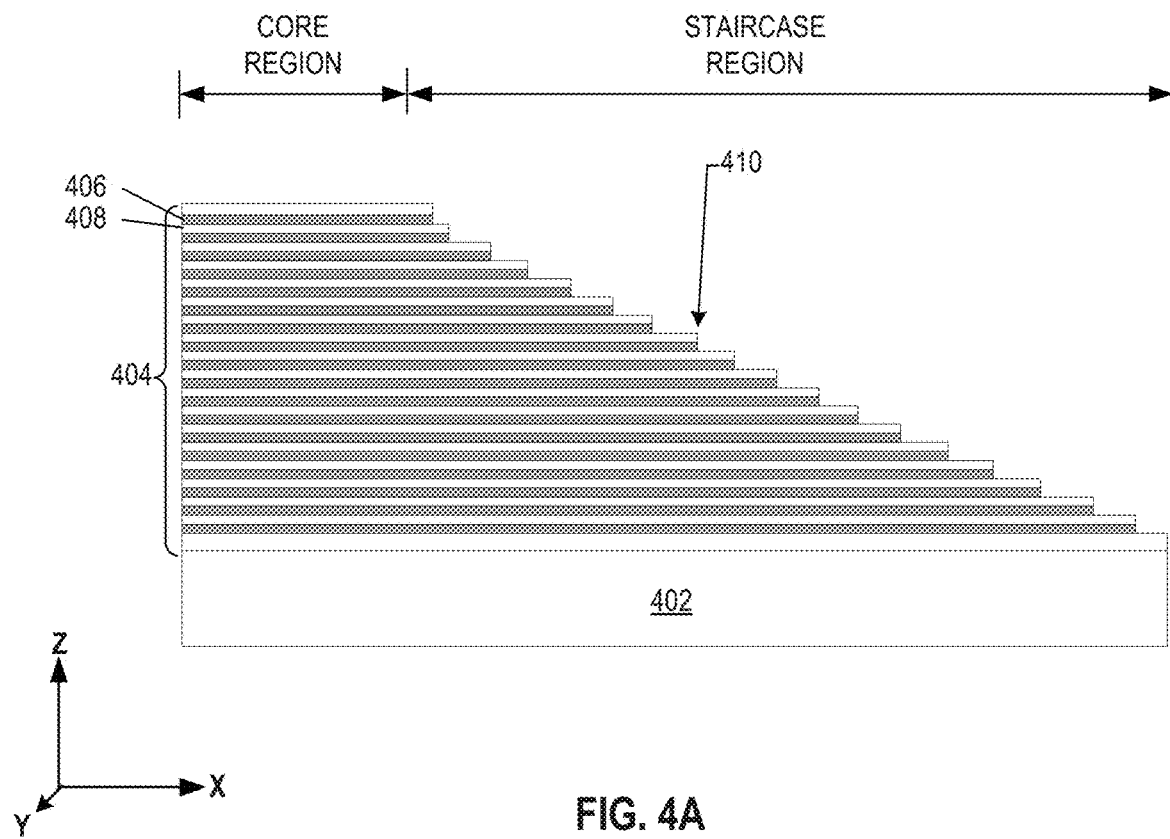
FIGS. 4A-4D illustrate cross-sectional views of a 3D memory device at various stages of an exemplary fabrication process, according to some implementations of the present disclosure.
Figure 4B:
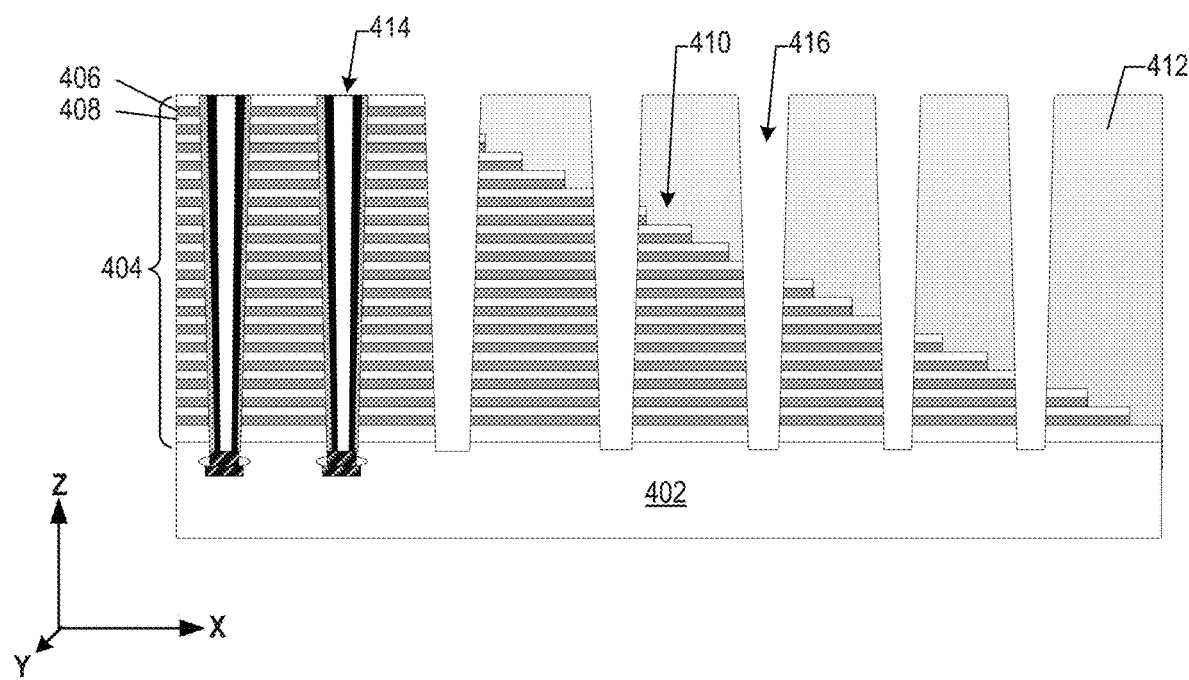
Figure 4C:
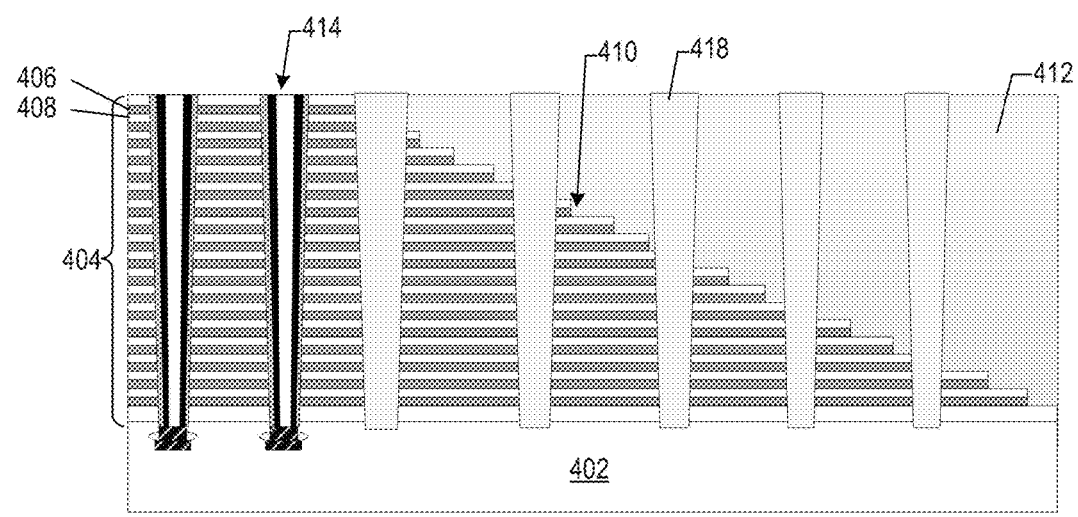
Figure 4D:
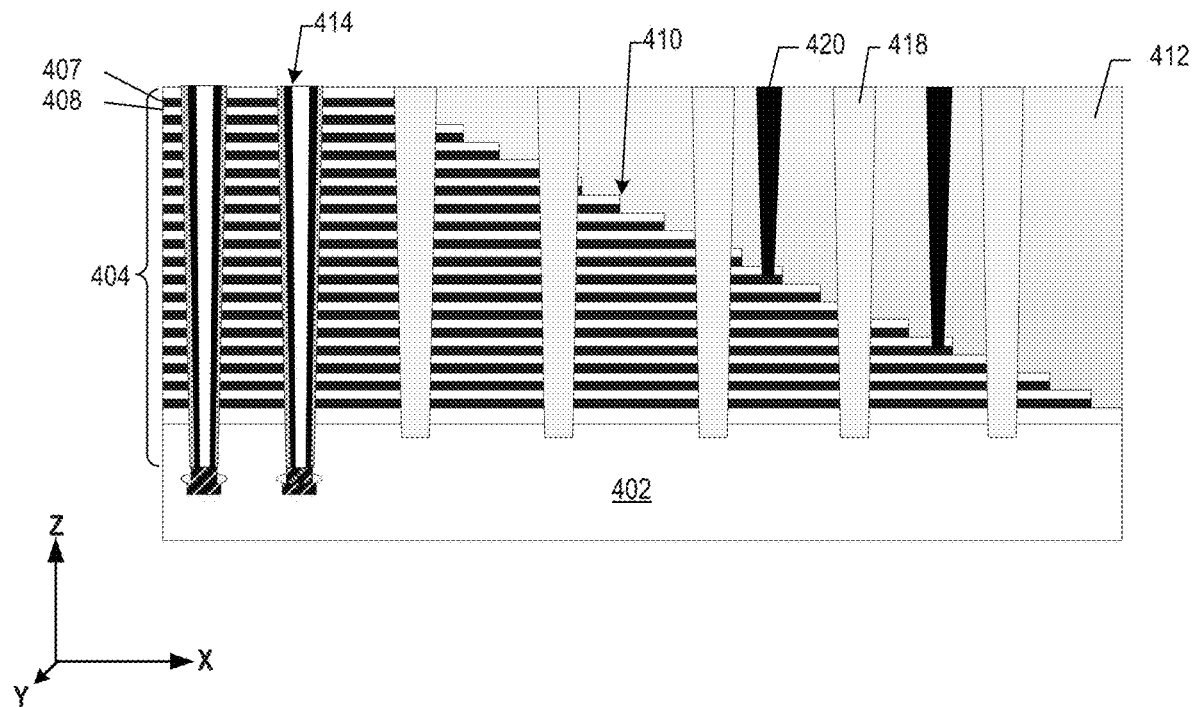
Figure 5:
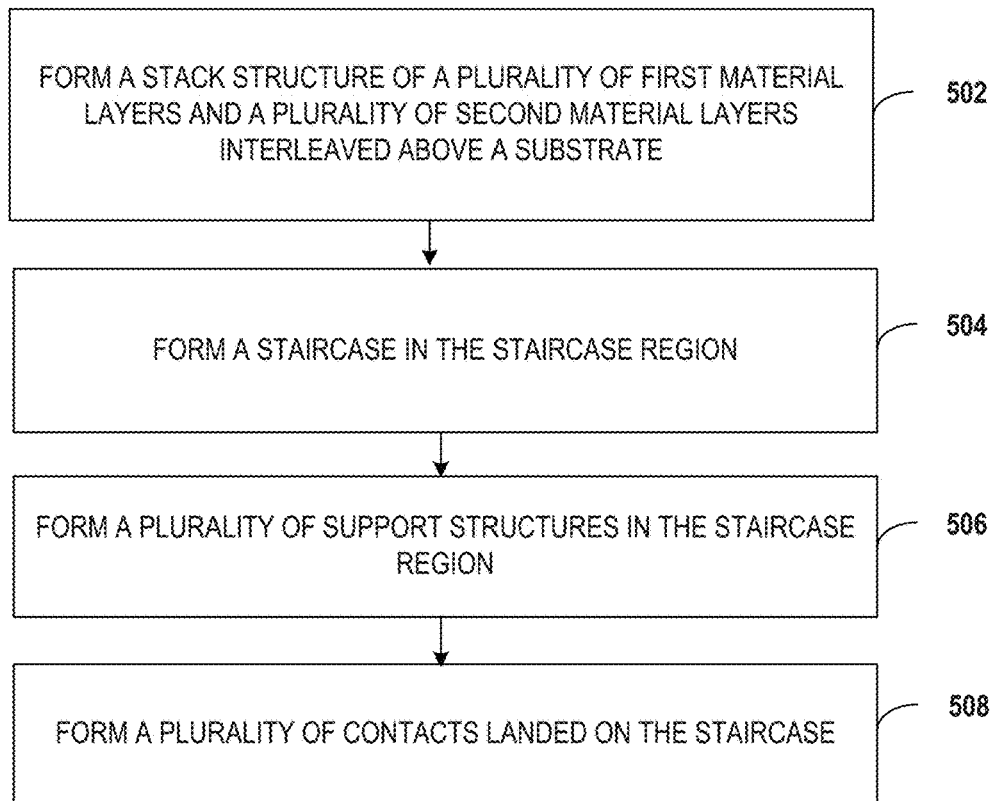
FIG. 5 illustrates a flowchart of an exemplary fabrication process for forming a 3D memory device having support structures and word line contacts, according to some implementations of the present disclosure.

FIGS. 4A-4D illustrate a fabrication process to form a 3D memory device, according to some implementations. FIG. 5 illustrates the flowchart of a method 500 to form the 3D memory device. Method 500 may be employed to form 3D memory devices 200, 201, and 203 illustrated in FIGS. 2A-2C. It is understood that the operations shown in method 500 are not exhaustive and that other operations can be performed as well before, after, or between any of the illustrated operations. Further, some of the operations may be performed simultaneously, or in a different order than shown in FIG. 5.

At the beginning of the process, at operations 502 and 504, a stack structure of a plurality of first material layers and a plurality of second material layers are formed interleaved above a substrate, and a staircase is formed in a staircase region. FIG. 4A illustrates a corresponding structure.

As shown in FIG. 4A, a plurality of first material layers and a plurality of second material layers are formed interleaved above a substrate 402. The first material layers and the second material layers may include different materials. A stack structure 404 may be formed in a core region and a staircase region of the 3D memory device. Stack structure 404 in the staircase region may be patterned to form a staircase extending laterally in the x-direction. The first material layers may be patterned to form a plurality of first layers 406, and the second material layers may be patterned to form a plurality of second layers 408. The staircase may include a plurality of stairs 410, each including one or more levels/stairs (e.g., first/second layer pairs).

The interleaved first material layers and second material layers can be formed by alternatingly depositing layers of first material and layers of second material over substrate 402 until a desired number of layers is reached. The first material layers and the second material layers can have the same or different thicknesses. In some implementations, the first material layers include a sacrificial material such as silicon nitride, and the second material layers include a dielectric material such as silicon oxide. In some implementations, the first material layers include a conductive material such as polysilicon, and the second material layers include a dielectric material such as silicon oxide. The deposition of the first material layers and the second material layers may each include one or more of chemical vapor deposition (CVD), physical vapor deposition (PVD), and atomic layered deposition (ALD).

The staircase, including a plurality of stairs 410, may be formed in the staircase region of the 3D memory device. The staircase can be formed by repetitively patterning stack structure 404, which includes the plurality of first/second material layer pairs formed by interleaved first material layers and second material layers, using an etch mask, e.g., a patterned PR layer over stack structure 404. In some implementations, one or more first/second material layer pairs can form one level/staircase. During the formation of the staircase, the PR layer is trimmed (e.g., etched incrementally and inwardly from the boundary of stack structure 404, often from all directions) and used as the etch mask for etching the exposed portion of stack structure 404. The amount of trimmed PR can be directly related (e.g., determinant) to the dimensions of the staircases. The trimming of the PR layer can be obtained using a suitable etch, e.g., an isotropic dry etch and/or a wet etch. One or more PR layers can be formed and trimmed consecutively for the formation of the staircase. Each first/second material pair can be etched, after the trimming of the PR layer, using suitable etchants to remove a portion of both the first material layer and the underlying second material layer. The etching of stack structure 404 may include a suitable dry etch and/or wet etch. The etched first material layers and second material layers may form the plurality of first layers 406 and second layers 408. The PR layer can then be removed.

Referring back to FIG. 5, after the formation of the staircase, method 500 proceeds to operation 506, in which a plurality of support structures are formed in the staircase region. FIGS. 4B and 4C illustrate corresponding structures.

As shown in FIGS. 4B and 4C, a plurality of openings 416 may be formed in the staircase region, and a plurality of support structures 418 may be formed in openings 416. In some implementations, a plurality of channel structures 414 may be formed in the core region of the 3D memory device, extending in stack structure 404 along the vertical direction (e.g., the z-direction). Channel structure 414 may have a memory film and a semiconductive layer. The memory film may include a blocking layer, a memory layer, and a tunneling layer. In some implementations, channel structure 414 includes a dielectric core. The blocking layer, the memory layer, the tunneling layer, the semiconductive layer, and the dielectric core (if any) may arrange inwardly from the sidewall towards the center of channel structure 414. In some implementations, a semiconductor plug is formed at the bottom of each channel structure 414, e.g., in the recess region. In some implementations, a drain structure is formed in the upper portion of each channel structure 414. The semiconductive layer may be in contact with and conductively connected to the semiconductor plug and the drain structure.

In some implementations, a plurality of channel holes may be formed in the core region of the 3D memory device, extending in the z-direction into substrate 402. The semiconductor plug may be formed by an epitaxial growth process and/or a deposition process in the channel holes. In some implementations, memory film is first deposited to cover the sidewall of each channel hole and the top surface of the epitaxial portion. The blocking layer, memory layer, and tunneling layer can be subsequently deposited in this order using one or more thin film deposition processes, such as ALD, CVD, PVD, any other suitable processes, or any combination thereof, to form memory film. A semiconductive layer may then be deposited over the memory film and above the epitaxial portion. The semiconductive layer can then be deposited on the tunneling layer using one or more thin film deposition processes, such as ALD, CVD, PVD, any other suitable processes, or any combination thereof. In some implementations, a dielectric core is filled in the remaining space of the channel hole by depositing dielectric materials after the deposition of the semiconductive layer. In some implementations, parts of the memory film, semiconductive layer, and dielectric core on the top surface of stack structure 404 and in the upper portion of each channel hole can be removed by CMP, grinding, wet etching, and/or dry etching to form a recess in the upper portion of the channel hole. Drain structure then can be formed by depositing conductive materials, such as metals, into the recess by one or more thin film deposition processes, such as CVD, PVD, ALD, electroplating, electroless plating, or any combination thereof. A channel structure 414 is thereby formed. Optionally, a planarization process, e.g., dry/wet etch and/or CMP, is performed to remove any excess material on the upper surface of stack structure 404.

An insulating structure 412 may be formed over stack structure 404 such that stack structure 404 is located in insulating structure 412. Insulating structure 412 may be formed by depositing a dielectric material, e.g., silicon oxide, over memory stack using a suitable deposition method such as CVD, PVD, ALD, or a combination thereof.

Openings 416 may be formed in the staircase region, extending in the staircase and insulating structure 412. Stack structure 404 may be patterned using an etch mask to form openings 416. In some implementations, the etch mask may include the patterns having the same as or similar to dimensions and/or locations of support structures shown in FIGS. 2A-2C. In various implementations, openings 416 may or may not be in contact with substrate 402. In some implementations, the bottom surfaces of openings 416 are below the upper surface of substrate 402. A suitable etching process, e.g., dry etch and/or wet etch, may be performed to form openings 416 in insulating structure 412 and stack structure 404.

A suitable deposition method, e.g., CVD, PVD, ALD, or a combination thereof, may be performed to deposit a dielectric material to fill openings 416. In some implementations, the dielectric material includes silicon oxide. Optionally, a planarization process, CMP and/or recess etch, may be performed to remove any recess material over stack structure 404 after the deposition process. Support structures 418 may be formed.

Referring back to FIG. 5, after the formation of the support structures, method 500 proceeds to operation 508, in which a plurality of contacts are formed landed on the staircase. FIG. 4D illustrates a corresponding structure.

As shown in FIG. 4D, a plurality of contacts 420 are formed extending in insulating structure 412. Contacts 420 may each be landed on a conductive layer 407 of a respective stair. In some implementations, a gate-replacement process may be performed to form a plurality of conductive layers 407. If first layer 406 includes a conductive material (e.g., polysilicon), no gate-replacement is performed, and each first layer 406 may form a conductive layer 407. If first layer 406 includes a sacrificial material (e.g., silicon nitride), a gate-replacement process may be performed to form a plurality of conductive layers 407. In some implementations, gate-line slits (not shown in FIGS. 4A-4D) are formed extending in the x-direction and the z-direction, in contact with substrate 402. The gate-line slits may be formed by removing a portion of stack structure 404 using a suitable etching process, e.g., dry etch and/or wet etch. To form conductive layers 407, first layers 406 may be removed through the gate-line slits to form a plurality of lateral recesses, using an isotropic etching process, e.g., wet etch. A conductive material, e.g., W, may then be deposited to fill up the lateral recesses, forming the plurality of conductive layers 407 in the lateral recesses. Accordingly, as shown in FIG. 4D, a memory stack, having interleaved a plurality of conductive layers 407 and second layers 408 (e.g., dielectric layers), may be formed. The deposition of the conductive material may include any suitable deposition methods such as CVD, PVD, ALD, or a combination thereof.

The gate-line slits may be formed by removing a portion of stack structure 404 using a suitable etching process, e.g., dry etch and/or wet etch. A suitable dielectric material, such as silicon oxide, can be deposited as a dielectric spacer in a gate-line slit. A suitable conductive material, such as W, can be deposited in the dielectric spacer to form a source contact. A source contact structure may thus be formed in the gate-line slit. The deposition of the dielectric material and the conductive material may each include any suitable deposition methods such as CVD, PVD, ALD, or a combination thereof.

Openings for forming contacts 420 may be formed in the staircase region, extending in insulating structure 412. Insulating structure 412 may be patterned using an etch mask to form the openings. In some implementations, the etch mask may include the patterns having the same as or similar to dimensions and/or locations of contacts shown in FIGS. 2A-2C. In some implementations, conductive layers 407 function as an etch stop layer for the openings. In some implementations, the bottom surfaces of the openings are in contact with conductive layers 407. A suitable etching process, e.g., dry etch and/or wet etch, may be performed to form the openings in insulating structure 412. A suitable deposition method, e.g., CVD, PVD, ALD, or a combination thereof, may be performed to deposit a conductive material, e.g., W, to fill the openings. Optionally, a planarization process, CMP and/or recess etch, may be performed to remove any recess material over stack structure 404 after the deposition process. Contacts 420 may be formed.

The present disclosure provides a 3D memory device. The 3D memory device includes a staircase and a plurality of groups of support structures through the staircase. The plurality of groups of support structures are arranged in a first direction. Each of the groups of support structures includes three support structures, wherein projections of the three support structures form a triangular shape in a plane parallel to the first direction.

In some implementations, a first support structure of each of the groups are aligned in the first direction.

In some implementations, a second support structure and a third support structure of each of the groups are aligned in the first direction.

In some implementations, a distance between two farthest support structures in each of the groups is in a range of about 350 to about 500 nm.

In some implementations, a minimum distance between the two support structures in each of the groups is in a range of about 300 nm to about 400 nm.

In some implementations, the 3D memory device further includes a plurality of contacts each 1 surrounded by a respective group. The plurality of contacts are aligned in the first direction and away from each of the support structures in the respective group.

In some implementations, a distance between each of the contacts to a support structure in the group is in a range of about 150 nm to about 300 nm.

In some implementations, the triangular shape includes an isosceles shape.

In some implementations, the 3D memory device further includes a fourth support structure between adjacent groups of support structures. In a second direction perpendicular to the first direction, a distance between the fourth support structure and each of the three support structure in the respective group is greater than or equal to half of a critical dimension of the fourth support structure and less than or equal to the critical dimension of the fourth support structure.

In some implementations, in the first direction, another distance between the fourth support structure and each of the three support structure in the respective group is greater than or equal to 1.5 times the critical dimension of the fourth support structure and less than or equal to 2 times the critical dimension of the fourth support structure.

In some implementations, the first direction is a direction in which a gate-line slit extends.

In some implementations, the plurality of groups of support structures are arranged in a pair of rows in the first direction between two adjacent gate-line slits.

In some implementations, the plurality of groups of support structures are arranged a first finger and a second finger adjacent to the first finger, and each of the three support structures in a respective group in the first finger is aligned with a corresponding support structure in another group in the second finger in a second direction perpendicular to the first direction.

The present disclosure provides a 3D memory device. The 3D memory device includes a plurality of contacts aligned in a row in a first direction on a staircase and a plurality of support structures arranged in a plurality of rows in the first direction. The row of the contacts and the plurality of rows of the support structures are apart from one another in a second direction perpendicular to the first direction. Each of the contacts is surrounded by a group of support structures, and the group of support structures includes three support structures, wherein projections of the three support structures form a triangular shape in a plane parallel to the first direction.

In some implementations, a first support structure in each group of support structures is located in one of two adjacent rows of support structures. In some implementations, a second support structure and a third support structure in each group of support structures are located in another one of the two adjacent rows of support structures.

In some implementations, a minimum distance between each of the contacts to a support structure in the group is in a range of about 150 nm to about 300 nm.

In some implementations, a distance between two farthest support structures in each of the groups is in a range of about 350 to about 500 nm.

In some implementations, the 3D memory device further includes a fourth support structure between adjacent groups of support structures. In a second direction perpendicular to the first direction, a distance between the fourth support structure and each of the three support structure in the respective group is greater than or equal to half of a critical dimension of the fourth support structure and less than or equal to the critical dimension of the fourth support structure.

In some implementations, in the first direction, another distance between the fourth support structure and each of the three support structure in the respective group is greater than or equal to 1.5 times the critical dimension of the fourth support structure and less than or equal to 2 times the critical dimension of the fourth support structure.

The present disclosure further provides a method for forming a 3D memory device. The method includes forming a stack structure of a plurality of first layers and a plurality of second layers interleaved above a substrate, and forming a staircase in a staircase region of the stack structure. The staircase includes a plurality of stairs. The method also includes forming a plurality of groups of support structures in the staircase and forming a contact on a respective one of the stairs. The plurality of groups of support structures each includes three support structures, wherein projections of the three support structures form a triangular shape in a plane parallel to a first direction.

In some implementations, the plurality of contacts are aligned in a row in the first direction. In some implementations, a plurality of support structure are arranged in a plurality of rows in the first direction. In some implementations, the row of the contacts and the plurality of rows of the support structures are apart from one another in a second direction perpendicular to the first direction.

In some implementations, the plurality of contacts are each surrounded by a respective group of support structures.

The foregoing description of the specific implementations can be readily modified and/or adapted for various applications. Therefore, such adaptations and modifications are intended to be within the meaning and range of equivalents of the disclosed implementations, based on the teaching and guidance presented herein.

Implementations of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The breadth and scope of the present disclosure should not be limited by any of the above-described exemplary implementations, but should be defined only in accordance with the following claims and their equivalents.

What is claimed is:

1. A three-dimensional (3D) memory device, comprising a staircase, a plurality of groups of support structures, and a fourth support structure between adjacent groups of support structures through the staircase, wherein:
   the plurality of groups of support structures are arranged in a first direction,
   each of the groups of support structures comprises three support structures, wherein projections of the three support structures form a triangular shape in a plane parallel to the first direction, and
   in a second direction perpendicular to the first direction, a distance between the fourth support structure and one of the three support structures in one of the adjacent groups is greater than or equal to half of a critical dimension of the fourth support structure and less than or equal to the critical dimension of the fourth support structure.

2. The 3D memory device of claim 1, wherein a first support structure of each of the groups are aligned in the first direction.

3. The 3D memory device of claim 2, wherein a second support structure and a third support structure of each of the groups are aligned in the first direction.

4. The 3D memory device of claim 1, wherein a distance between two farthest support structures in each of the groups is in a range of about 350 to about 500 nm.

5. The 3D memory device of claim 4, wherein a minimum distance between the two support structures in each of the groups is in a range of about 300 nm to about 400 nm.

6. The 3D memory device of claim 1, further comprising a plurality of contacts each surrounded by a respective group, wherein the plurality of contacts are aligned in the first direction and away from each of the support structures in the respective group.

7. The 3D memory device of claim 6, wherein a distance between each of the contacts to a support structure in the group is in a range of about 150 nm to about 300 nm.

8. The 3D memory device of claim 1, wherein the triangular shape comprises an isosceles shape.

9. The 3D memory device of claim 1, wherein, in the first direction, another distance between the fourth support structure and one of the three support structures in one of the adjacent groups is greater than or equal to 1.5 times the critical dimension of the fourth support structure and less than or equal to 2 times the critical dimension of the fourth support structure.

10. The 3D memory device of claim 1, wherein the first direction is a direction in which a gate-line slit extends.

11. The 3D memory device of claim 10, wherein the plurality of groups of support structures are arranged in a pair of rows in the first direction between two adjacent gate-line slits.

12. The 3D memory device of claim 1, wherein the plurality of groups of support structures are arranged a first finger and a second finger adjacent to the first finger, and each of the three support structures in a respective group in the first finger is aligned with a corresponding support structure in another group in the second finger in a second direction perpendicular to the first direction.

13. A three-dimensional (3D) memory device, comprising:
   a plurality of contacts aligned in a row in a first direction on a staircase;
   a plurality of groups of support structures aligned in a plurality of rows in the first direction; and
   a fourth support structure between adjacent groups of support structures, wherein:
   the row of the contacts and the plurality of rows of the support structures are apart from one another in a second direction perpendicular to the first direction;
   each of the contacts is surrounded by a group of support structures;
   the group of support structures comprises three support structures, wherein projections of the three support structures form a triangular shape in a plane parallel to the first direction; and
   in the first direction, a distance between the fourth support structure and one of the three support structures in one of the adjacent groups is greater than or equal to 1.5 times a critical dimension of the fourth support structure and less than or equal to 2 times the critical dimension of the fourth support structure.

14. The 3D memory device of claim 13, wherein
   a first support structure in each group of support structures is located in one of two adjacent rows of support structures; and
   a second support structure and a third support structure in each group of support structures are located in another one of the two adjacent rows of support structures.

15. The 3D memory device of claim 13, wherein a minimum distance between each of the contacts to a support structure in the group is in a range of about 150 nm to about 300 nm.

16. The 3D memory device of claim 13, wherein a distance between two farthest support structures in each of the groups is in a range of about 350 to about 500 nm.

17. The 3D memory device of claim 14, further comprising a fourth support structure between adjacent groups of support structures, wherein, in a second direction perpendicular to the first direction, a distance between the fourth support structure and each of the three support structures in the respective group is greater than or equal to half of a critical dimension of the fourth support structure and less than or equal to the critical dimension of the fourth support structure.

18. A method for forming a three-dimensional (3D) memory device, comprising:
- forming a stack structure of a plurality of first layers and a plurality of second layers interleaved above a substrate;
- forming a staircase in a staircase region of the stack structure, the staircase comprising a plurality of stairs;
- forming a plurality of groups of support structures in the staircase; and
- forming a contact on a respective one of the stairs; and
- forming a fourth support structure between adjacent groups of support structures, wherein
- the plurality of groups of support structures each comprises three support structures, wherein projections of the three support structures form a triangular shape in a plane parallel to a first direction, and
- in a second direction perpendicular to the first direction, a distance between the fourth support structure and one of the three support structures in one of the adjacent groups is greater than or equal to half of a critical dimension of the fourth support structure and less than or equal to the critical dimension of the fourth support structure.

19. The method of claim 18, wherein
- the plurality of contacts are aligned in a row in the first direction;
- a plurality of support structures are arranged in a plurality of rows in the first direction; and
- the row of the contacts and the plurality of rows of the support structures are apart from one another in a second direction perpendicular to the first direction.

* * * * *